United States Patent [19]

Akiyama et al.

[11] Patent Number: 5,149,614

[45] Date of Patent: Sep. 22, 1992

[54] DEVELOPER COMPOSITIONS FOR PS PLATES AND METHOD FOR DEVELOPING THE SAME WHEREIN THE DEVELOPER COMPOSITION CONTAINS A SURFACTANT HAVING AN ARYL GROUP, AN OXYALKYLENE GROUP AND A SULFATE ESTER OR SULFONIC ACID GROUP

[75] Inventors: Keiji Akiyama; Hiroshi Misu, both of Shizuoka, Japan

[73] Assignee: Fuji Photo Film Co., Ltd., Minami-ashigara, Japan

[21] Appl. No.: 349,095

[22] Filed: May 9, 1989

[30] Foreign Application Priority Data

May 10, 1988 [JP] Japan .................... 63-112885

[51] Int. Cl.⁵ .................... G03F 7/023; G03F 7/32
[52] U.S. Cl. .................... 430/302; 430/165; 430/192; 430/278; 430/309; 430/331
[58] Field of Search .............. 430/165, 309, 302, 326, 430/331, 192, 278

[56] References Cited

U.S. PATENT DOCUMENTS

| | | |
|---|---|---|
| 4,186,006 | 1/1980 | Kobayashi et al. ............. 430/331 |
| 4,259,434 | 3/1981 | Yamasue et al. ............. 430/302 |
| 4,467,027 | 8/1984 | Yamamoto et al. ............. 430/302 |
| 4,606,995 | 8/1986 | Kita et al. ............. 430/309 |
| 4,617,250 | 10/1986 | Nakakita et al. ............. 430/157 |
| 4,837,131 | 6/1989 | Kobayashi et al. ............. 430/302 |

FOREIGN PATENT DOCUMENTS 59-195641 3/1979 Japan .

Primary Examiner—Charles L. Bowers, Jr.
Assistant Examiner—John S. Chu
Attorney, Agent, or Firm—Burns, Doane, Swecker & Mathis

[57] ABSTRACT

A developer composition for presensitized plates for use in making lithographic printing plates comprises water, an alkali silicate and at least one compound having at least one aryl group, at least one oxyalkylene group and at least one sulfate ester group or sulfonic acid group. The composition is excellent in developing stability and processability. It is less foamable and seldom generates deposits even when it is deteriorated. Moreover, the composition makes it possible to develop both positive- and negative-working PS plates.

8 Claims, No Drawings

DEVELOPER COMPOSITIONS FOR PS PLATES AND METHOD FOR DEVELOPING THE SAME WHEREIN THE DEVELOPER COMPOSITION CONTAINS A SURFACTANT HAVING AN ARYL GROUP, AN OXYALKYLENE GROUP AND A SULFATE ESTER OR SULFONIC ACID GROUP

BACKGROUND OF THE INVENTION

The present invention relates to a developer composition for presensitized plates for use in making lithographic printing plates (hereunder referred to as "PS plates") and a method for developing PS plates.

It is known that diazo groups of o-quinonediazide compounds are dissociated by irradiating them with actinic rays and thus the o-quinonediazide compounds are converted to those having carboxylic acid groups. If an imagewise exposed light-sensitive layer containing such an o-quinonediazide compound is developed with an alkaline developer, the exposed portion thereof is removed and the un-exposed portion thereof forms images. Therefore, such o-quinonediazide compounds are recently widely used as so-called positive working light-sensitive components for, in particular, compositions for light-sensitive layers of PS plates or for photoresist compositions for use in etching. Particularly, compositions composed of o-quinonediazide compounds admixed with alkali-soluble resins are favorably used for economical and practical reasons. Among these, those admixed with a novolak type phenol-formaldehyde condensed resin or cresolformaldehyde condensed resin are generally used.

As developers for light-sensitive layers containing these o-quinonediazide compounds, there is used an aqueous solution containing sodium tertiary phosphate, sodium hydroxide, sodium silicate, potassium silicate, ammonium silicate or a mixture thereof. However, aqueous solutions of sodium hydroxide, sodium tertiary phosphate and the like strongly etch metal plates such as aluminum plate and, therefore, they are unfavorable as developers for PS plates in which metal plates are used as substrates, depending on developing time. Moreover, it is difficult to achieve uniform development of PS plates and in the worst case, it is sometimes observed that images are disappeared if developing time is only slightly extended. Moreover, a developer is remarkably deteriorated when it is repeatedly used and thus processability of a constant volume of a developer (i.e., the amount of PS plates which can be processed with such an amount of a developer) is quite low. For this reason, there have rather favorably been used an aqueous solution of sodium silicate or potassium silicate recently. This is because these aqueous solutions have low etching power and the developability thereof can be controlled to some extent by adjusting the concentration of silicon oxide ($SiO_2$) and sodium oxide ($Na_2O$) or potassium oxide ($K_2O$) which are components of sodium silicate or potassium silicate and the ratio ($SiO_2/Na_2O$ or $SiO_2/K_2O$) (in general expressed in molar ratio). In other words, as the amount of $SiO_2$ increases, developing power of a developer is suppressed and developing stability thereof is increased, while as the amount of $Na_2O$ or $K_2O$ increases, the developing power becomes high and the developing stability is lowered. The term "developing stability" herein used means stability of images as a function of developing time. Thus, if only the amount of $Na_2O$ or $K_2O$ increases, images are apt to disappear within a short time period.

Processability of a constant volume of a developer becomes high as the content of $Na_2O$ or $K_2O$ increases. Therefore, the developability, stability and processability can be imparted to a developer to some degree by increasing the total concentration while adjusting the ratio: $SiO_2/Na_2O$ or $SiO_2/K_2O$ as a function of developing power and developing stability. However, these developers do not satisfy these requirements at the same time. More specifically, if a desired level of developing power is established, stability is impaired and if a desired stability is established, developing power and processability would be impaired. In addition, these solutions contain such components in a relatively high concentration. Thus they easily form precipitates and a large amount of an acid is needed to neutralize them in treating waste.

The summary of the problems of the aforementioned developers containing sodium hydroxide, sodium tertiary phosphate, sodium silicate, potassium silicate or the like is as follows: if the strength of alkali is increased, the developing power and processability of the developers are improved, but the developing stability thereof is insufficient. Moreover, the concentration of alkalis must be reduced to achieve developing stability, but this leads to reduction of processability. Thus, high developing stability can be imparted to a developer while maintaining high alkali strength thereof, to obtain excellent developers.

As means for obtaining desired developers having good developing stability while holding high alkali strength, Japanese Patent Unexamined Publication (hereunder referred to as "J. P. KOKAI") No. Sho 50-51324 discloses a method comprising adding an anionic surfactant or an amphoteric surfactant to a developer; J. P. KOKAI No. Sho 55-95946 discloses a method which comprises adding a water-soluble cationic polymer to a developer; and J. P. KOKAI No. Sho 56-142528 discloses a method comprising a water-soluble amphoteric polymeric electrolyte to a developer.

However, if these developers are used in an automatic developing machine for a long time period, there is observed foaming during developing operations. Moreover, if such developers are stored for a long time period after a long term processing, water is evaporated and generation of deposits such as sludge and/or feculence which sometimes result in various troubles such as contamination of lithographic printing plates in an automatic developing machine, clogging of a pump, and so on.

SUMMARY OF THE INVENTION

Accordingly an object of the present invention is to provide a developer composition which is excellent in developing stability and processability, which is less foamable and which seldom generates deposits even when it is deteriorated.

Another object of the present invention is to provide a developer composition which makes it possible to develop both negative-working and positive working PS plates and a method for developing these PS plate using such a developer composition.

The aforementioned objects of the present invention can effectively be achieved by providing a developer composition for PS plates, which comprises water, an alkali silicate and at least one compound having at least one aryl group, at least one oxyalkylene group and at least one sulfate ester group or sulfonic acid group.

DETAILED EXPLANATION OF THE INVENTION

The present invention will hereinunder be explained in more detail.

Examples of such compounds preferably used in the invention include those represented by the following general formula (I):

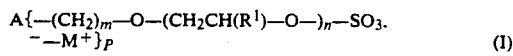

$$A\{-(CH_2)_m-O-(CH_2CH(R^1)-O-)_n-SO_3^- -M^+\}_p \quad (I)$$

In formula (I), A represents an optionally substituted aryl group; $R^1$ represents a hydrogen atom or a lower alkyl group; M represents a hydrogen atom, an alkali metal or an ammonium group; m is 0 or an integer of not less than 1, n is 0 or a positive number provided that m and n are not zero simultaneously; and p is an integer of 1 to 5.

The aryl group A is preferably a phenyl or naphthyl group, more preferably a naphthyl group. The aryl group may have at least one substituent. Preferred examples of such substituents include alkyl groups having 1 to 18, preferably 1 to 12 carbon atoms, alkenyl groups having 2 to 18 carbon atoms, aralkyl groups having 7 to 18 carbon atoms, alkoxy groups having 1 to 18 carbon atoms, nitro group, and halogen atoms. Examples of lower alkyl groups, $R^1$, include those having 1 to 3 carbon atoms and preferably methyl group. Preferred examples of alkali metal M include sodium and potassium and examples of ammonium group include $NH_4$ and $NH(C_2H_5)_3$. m represents 0 or an integer of not less than 1, preferably 0 or an integer ranging from 1 to 5 and more preferably 0. n represents 0 or a positive number, preferably 0 or a number of up to 30. n herein means an average added mole number of oxides. Therefore, the compounds represented by the foregoing formula (I) of course include mixtures of those differing in the added mole number of oxides. In addition, m and n cannot be zero simultaneously as already mentioned above. p is an integer of 1 to 5 and in particular 1 or 2.

Particularly preferred compounds represented by the general formula (I) will be listed below, but the invention is not restricted to these specific examples.

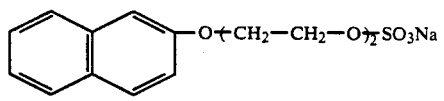
(1)

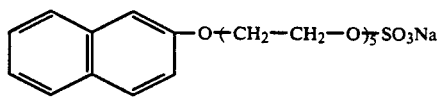
(2)

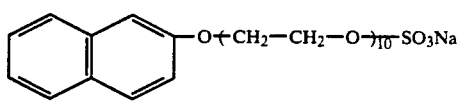
(3)

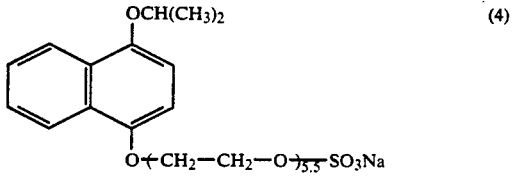
(4)

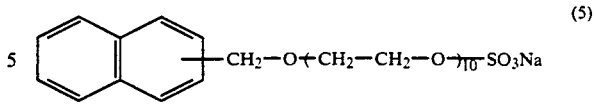
(5)

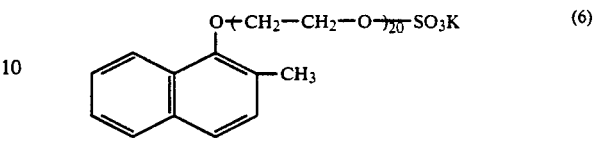
(6)

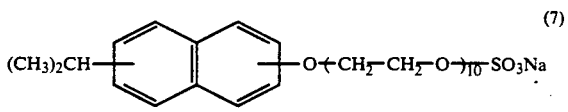
(7)

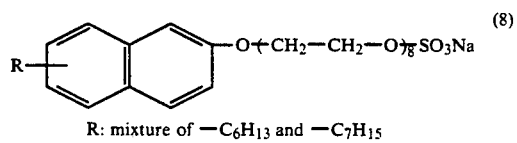
(8)

R: mixture of $-C_6H_{13}$ and $-C_7H_{15}$

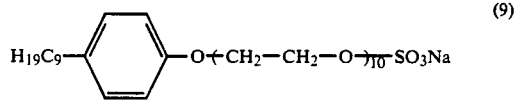
(9)

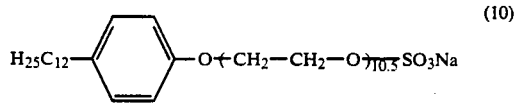
(10)

The compounds of the formula (I) can be prepared by the process disclosed in J. P. KOKAI No. Sho 59-195641 (U.S. Ser. No. 601,814 filed Apr. 19, 1984, now abandoned).

The amount of the aforementioned compounds to be added to the developer composition ranges from 0.1 to 10% by weight and preferably 0.1 to 5% by weight on the basis of the total weight of the composition.

The developer composition of the present invention is fundamentally an aqueous solution of an alkali silicate. Examples of such alkali silicates are sodium silicate, potassium silicate, lithium silicate and ammonium silicate which may be used alone or in combination. The molar ratio $SiO_2/M_2O$ (wherein M is an alkali metal) of the alkali silicate preferably ranges from 0.5 to 3.0 and more preferably 1.0 to 2.0. The developability of the developer tends to decrease as the molar ratio exceeds 3.0 while the alkali strength thereof increases as it becomes smaller than 0.5. Therefore, the use of such developer having high alkali strength is attended by an adverse effect that metal such as aluminum plates widely used as substrates for PS plates are etched. The concentration of an alkali silicate in the developer preferably ranges from 1 to 10% by weight and more preferably 1.5 to 7% by weight on the basis of the total weight of the composition. This is because if the concentration exceeds 10% by weight, precipitates and/or crystals are easily formed and such a developer easily causes gelation when its waste is neutralized during waste disposal. Therefore, treatment of waste becomes very troublesome. On the other hand, if the concentration is lower than 1% by weight, the developing power and processability of the developer are lowered.

In addition, the developer may optionally contain other alkaline agents. Examples of such alkaline agents are such an inorganic alkaline agent as potassium hydroxide, sodium hydroxide, lithium hydroxide, sodium tertiary phosphate, sodium secondary phosphate, ammonium tertiary phosphate, ammonium secondary phoshate, sodium metasilicate, sodium bicarbonate, sodium borate, ammonium borate or ammonia; and such an organic amine compound as monomethylamine, dimethylamine, trimethylamine, monoethylamine, diethylamine, triethylamine, monoisopropylamine, diisopropylamine, n-butylamine, monoethanolamine, diethanolamine, triethanolamine, monoisopropanolamine, diisopropanolamine, ethyleneimine, ethylenediamine and pyridine which may be used alone or in combination.

The developer composition of this invention may further comprise organic solvents and/or anionic surfactants according to need. Examples of such anionic surfactants are such $C_8$ to $C_{22}$ higher alcohol sulfate ester salts as sodium salt of lauryl alcohol sulfate, sodium salt of octyl alcohol sulfate, ammonium salt of lauryl alcohol sulfate and disodium alkyl sulfates; such aliphatic alcohol sulfate ester salts as sodium salt of acetylalcohol sulfate ester; such alkyl aryl sulfonic acid salts as sodium salt of dodecylbenzene-sulfonic acid, sodium salt of isopropyl-naphthalene sulfonic acid and sodium salt of metanitrobenzene-sulfonic acid; such sulfonic acid salts of alkylamides as $C_{17}H_{33}CON(CH_3)CH_2CH_2SO_3Na$; and such sulfonic acid salts of dibasic aliphatic acid esters as sodium dioctyl sulfosuccinate and sodium dihexyl sulfosuccinate. These anionic surfactants may be used alone or in combination.

These anionic surfactants are used in an amount of 0.1 to 5% by weight on the basis of the total weight of the developer practically used. This is because if it is less than 0.1% by weight, the effect thereof is very low, while if it is more than 5% by weight, there are observed various adverse effects that, for instance, dyes included in a photohardenable light-sensitive layer are excessively dissolved out (color blinding) from photohardened portions thereof and that mechanical and/or chemical strength such as wear resistance of photohardened images is impaired.

As organic solvents, preferred are selected from those having a water-solubility of not more than about 10% by weight and preferably not more than 2% by weight. Specific examples thereof are 1-phenyl ethanol, 2-phenyl ethanol, 3-phenyl-propanol-1; 4-phenyl-butanol-1; 4-phenyl-butanol-2; 2-phenyl-butanol-1; 2-phenoxy ethanol, 2-benzyloxy ethanol, o-methoxybenzyl alcohol, m-methoxybenzyl alcohol, p-methoxybenzyl alcohol, benzyl alcohol, cyclohexanol, 2-methyl cyclohexanol, 4-methyl cyclohexanol and 3-methyl cyclohexanol. These organic solvents may be incorporated into the developer composition, alone or in combination.

These organic solvents are preferably used in an amount ranging from 1 to 5% by weight on the basis of the total weight of the developer practically used. The amount of these organic solvents is closely correlated with that of the surfactant and the latter is preferably increased as the former increases. This is because if the amount of the surfactant is small and that of the organic solvents is great, the organic solvents are not dissolved in the developer and thus good developability thereof cannot be obtained.

Moreover, the developer composition may optionally comprise additives such as alkali-soluble mercapto compounds and/or thioether compounds; antifoaming agents and softening agent for hard water. Examples of such softening agents for hard water include such polyphosphates as $Na_2P_2O_7$, $Na_5P_3O_3$, $Na_3P_3O_9$, $Na_2O_4P(NaO_3P)PO_3Na_2$ and Calgon (sodium polymetaphosphate); and such polyaminocarboxylic acids or salts thereof as ethylenediaminetetraacetic acid and sodium and potassium salts thereof, diethylenetriaminepentaacetic acid and sodium and potassium salts thereof, triethylenetetraminehexaacetic acid and sodium and potassium salts thereof, hydroxyethylethylenediaminetriacetic acid and sodium and potassium salts thereof, nitrilotriacetic acid and sodium and potassium salts thereof, 1,2-diaminocyclohexanetetraacetic acid and sodium and potassium salts thereof, and 1,3-diamino-2-propanol-tetraacetic acid and sodium and potassium salts thereof. These softening agents may be used alone or in combination and the optimum amount thereof used varies depending on hardness and the amount of hard water employed, but they are in general used in an amount ranging from 0.01 to 5% by weight, preferably 0.01 to 0.5% by weight on the basis of the total weight of the developer practically used.

The alkali-soluble mercapto compounds and/or thioether compounds are preferably those having at least one m ercapto group and/or thioether group and at least one acid group in the molecule and more preferably those having at least one mercapto group and at least one carboxyl group in the molecule. Specific examples thereof include mercaptoacetic acid, 2-mercaptopropionic acid, 3-mercaptopropionic acid, 4-mercaptobutanoic acid, 2,4-dimercaptobutanoic acid, 2-mercaptotetradecanoic acid, mercapto-succinic acid, 2,3-dimercaptosuccinic acid, cysteine, N-acetyl cysteine, N-(2-mercaptopropionyl) glycine, N-(2-mercapto-2-methylpropionyl)glycine, N-(3-mercaptopropionyl)glycine, N-(2-mercapto-2-methylpropionyl)cysteine, penicillamine, N-acetyl-penicillamine, glycine.cysteine.glutamine condensate, N-(2,3-dimercaptopropionyl)glycine, 2-mercaptonicotinic acid, thiosalicylic acid, 3-mercaptobenzoic acid, 4-mercaptobenzoic acid, 3-carboxy-2-mercaptopyridine, 2-mercaptobenzothiazole-5-carboxylic acid, 2-mercapto-3-phenylpropenic acid, 2-mercapto-5-carboxyethyl-imidazole, 5-mercapto-1-(4-carboxyphenyl)tetrazole, N-(2,5-dicarboxy-phenyl)-2-mercaptotetrazole, 2-(1,2-dicarboxyethylthio)-5-mercapto-1,3,4-thiadiazole, 2-(5-mercapto-1,3,4-thiadiazolylthio)hexanoic acid, 2-mercaptoethane sulfonic acid, 2,3-dimercapto-1-propane sulfonic acid, 2-mercaptobenzenesulfonic acid, 4-mercaptobenzenesulfonic acid, 3-mercapto-4-(2-sulfophenyl)-1,2,4-triazole, 2-mercapto-benzothiazole-5-sulfonic acid, 2-mercaptobenzoimidazole-6-sulfonic acid, mercaptosuccinimide, 4-mercaptobenzenesulfonamide, 2-mercaptobenzoimidazole-5-sulfonamide, 3-mercapto-4-(2-methylamino-sulfonyl)ethoxy)toluene, 3-mercapto-4-(2-(methylsulfonylamino)ethoxy)toluene, 4-mercapto-N-(p-methylphenyl-sulfonyl)benzamide, 4-mercaptophenol, 3-mercaptophenol, 3,4-dimercapto-toluene, 2-mercapto-hydroquinone, 2-thiouracil, 3-hydroxy-2-mercaptopyridine, 4-hydroxy-thiophenol, 4-hydroxy-2-mercaptopyrimidine, 4,6-dihydroxy-2-mercaptopyrimidine, 2,3-dihydroxypropylmercaptan, tetraethylene glycol, 2-mercapto-4-octylphenyl methyl ether, 2-mercapto-4-octylphenyl-methanesulfonyl-aminoethyl ether, 2-mercapto-4-octylphenyl-methylamino-sulfonylbutyl ether, thiodiglycolic acid, thiodiphenol, 6,8-dithiooctanoic acid or alkali metal, alkaline earth metal or organic amine salts thereof. These compounds may be used alone or in combination. Particularly preferred are thiosalicylic acid, N-(2,3-dimercaptopropionyl)glycine, 2-(1,2-dicarboxyethylthio)-5-mercapto-1,3,4-thiadiazole, 4-mercapto-benzene sulfonic acid, N-(2-mercapto-2-methyl-propionyl)cysteine and cysteine. These compounds may be added to the developer composition in an amount ranging from 0.001 to 10% by weight and preferably 0.01 to 5% by weight on the basis of the total weight of the composition.

The developed PS plates may optionally be subjected to a desensitization treatment directly or after washing with water or after treating with an aqueous solution containing an acid. Moreover, in a development process for such PS plates, an alkali solution is consumed depending on the amount of PS plates processed to thus cause reduction of alkali concentration or alkali is consumed by air when an automatic developing machine is operated for a long time and thus the processability of the developer is lowered. In such a case, the processability may be restored by supplementing a replenisher as disclosed in J. P. KOKAI No. Sho 54-62004 (U.S. Pat. No. 4,259,434).

The o-quinonediazide light-sensitive layers to which the developer of the present invention is applied are light-sensitive reproduction layers containing, as light-sensitive components, o-quinonediazide compounds which increase their alkali-solubility when they are irradiated with actinic rays.

Such light-sensitive materials are detailed in, for instance, J. Koser, "Light-sensitive Systems", issued by John Willey & Sons, Inc. or "KANKOSEI JUSHI DATA SHU (Collected Data of Light-sensitive Resins)", edited by SOGO KAGAKU KENKYUSHO (Laboratory of Synthetic Chemistry). In particular, generally and frequently used are those composed of a mixture of an o-quinonediazide sulfonic acid ester of aromatic polyhydroxy compound and an alkali-soluble resin such as phenol resin, cresol resin or styrene-maleic anhydride copolymer and they have been used for forming PS plates or resists for photoetching. The developer of this invention is most favorably used in developing particularly positive-working PS plates having o-quinonediazide light-sensitive layers. Such positive-working PS plates are fundamentally composed of an aluminum plate as a substrate provided thereon with light-sensitive layers comprising o-quinonediazide compounds.

Examples of preferred aluminum plates include pure aluminum plate and plates of aluminum alloys as well as plastic films which are laminated with aluminum sheets or to which alminum is deposited. The surface of the aluminum plates are preferably subjected to a surface treatment such as graining, treatment by immersing in an aqueous solution of sodium silicate, potassium fluorozirconate, a phosphate or the like, or anodization treatment. In addition, the following may preferably be used: those grained and then dipped in an aqueous solution of sodium silicate as disclosed in U.S. Pat. No. 2,714,066; and those anodized and then dipped in an aqueous solution of an alkali metal silicate as disclosed in Japanese Patent Publication for Opposition Purpose (hereunder referred to as "J.P. KOKOKU") No. Sho 47-5125 (U.S. Pat. No. 3,181,461). The foregoing anodization can be performed by passing an electric current through an aluminum plate serving as an anode in an electrolyte selected from the group consisting of aqueous solutions or organic solutions of an inorganic acid such as phosphoric acid, chromic acid, sulfuric acid or boric acid; or an organic acid such as oxalic acid or sulfamic acid, or a combination of these solutions.

Moreover, it is also effective to adopt silicate electrodeposition as disclosed in U.S. Pat. No. 3,658,662.

Also useful are those subjected to electrolytic graining and then to the foregoing anodization as disclosed in U.S. Pat. No. 4,087,341; J.P. KOKOKU No. Sho 46-27481 and J.P. KOKAI No. Sho 52-30503; those subjected to graining, then chemical etching and anodization as disclosed in U.S. Pat. No. 3,834,998. These hydrophilization treatment is performed for various purposes such as hydrophilization of the surface of a substrate, prevention of occurrence of detrimental reactions with light-sensitive composition which are applied onto the surface and improvement of adhesion between the surface and the light-sensitive layer.

Light-sensitive layers applied onto the hydrophilized surface of a substrate are composed of o-quinonediazide compounds. Particularly preferred are o-naphthoquinonediazide compounds and specific examples thereof are disclosed in various publications such as U.S. Pat. Nos. 3,046,110; 3,046,111; 3,046,112; 3,046,115; 3,046,118; 3,046,119; 3,046,120; 3,046,121; 3,046,122; 3,046,123; 3,061,430; 3,102,809; 3,106,465; 3,635,709 and 3,647,443 which may suitably be used in the present invention. Particularly preferred are o-naphthoquinonediazide sulfonic acid esters or o-naphthoquinonediazide carboxylic acid esters of aromatic hydroxy compounds and o-naphthoquinonediazide sulfonic acid amides or o-naphthoquinonediazide carboxylic acid amides of aromatic hydroxyl compounds; in particular an esterified product of pyrogallol-acetone condensate and o-naphthoquinonediazide sulfonic acid as disclosed in U.S. Pat. No. 3,635,709; an esterified product of a polyester having a terminal hydroxyl group and o-naphthoquinonediazide sulfonic acid or o-naphthoquinone-diazide carboxylic acid as disclosed in U.S. Pat. No. 4,028,111; an esterified product of a homopolymer of p-hydroxystyrene or a copolymer of p-hydroxystyrene and other copolymerizable monomers with o-naphthoquinonediazide sulfonic acid or o-naphthoquinonediazide carboxylic acid as disclosed in U.K. Pat. No. 1,494,043; and an amine product of a copolymer of p-aminostyrene and other copolymerizable monomers with o-naphthoquinonediazide sulfonic acid or o-naphthoquinonediazide carboxylic acid as disclosed in U.S. Pat. No. 3,759,711.

These o-quinonediazide compounds may be used alone, but it is preferred that the compounds combined with an alkali-soluble resin are applied onto a substrate as a light-sensitive layer. Such alkali-soluble resins include novolak type phenol resins and specific examples thereof are phenol-formaldehyde resin, o-cresol-formaldehyde resin and m-cresol-formaldehyde resin. More preferably, the foregoing phenol resins are used in combination with condensates of formaldehyde and phenol or cresol substituted with alkyl groups having 3 to 8 carbon atoms such as t-butylphenol-formaldehyde resin as disclosed in J.P. KOKAI No. Sho 50-125806 (U.S. Pat. No. 4,123,279). These alkali-soluble resins are preferably incorporated into the light-sensitive layer in an amount ranging from about 50 to about 85% by weight, more preferably 60 to 80% by weight based on the total weight of the layer.

The light-sensitive layer comprised of o-quinonediazide compounds may optionally comprise additives such as dyes, plasticizers and components for imparting print out properties to the layer.

These dyes are used to impart, to image areas, a desired contrast with non-image areas (the surface of a substrate) obtained after imagewise exposure to light and development and preferred examples are alcohol-soluble dyes such as C.I. 26, 105 (Oil Red RR); C.I. 21, 260 (Oil Scarlet #308); C.I. 42, 595 (Oil Blue); C.I. 52, 015 (Methylene Blue); and C.I. 42, 555 (Crystal Violet). These dyes are added to a light-sensitive layer in an amount sufficient to impart distinct contrast between remaining part of the light-sensitive layer and the color of the hydrophilic surface of a substrate exposed after imagewise exposure and development and it is generally preferred that these dyes be added in an amount of not more than about 7% by weight based on the total weight of the light-sensitive composition.

The plasticizers are effective for imparting desired flexibility to a light-sensitive layer applied onto the surface of a substrate and examples of effective plasticizers include such phthalates as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate and diallyl phthalate; such glycol esters as dimethyl glycol phthalate, ethyl phthlalylethyl glycolate, methyl phthalylethyl glycolate, butyl phthalylbutyl glycolate and triethylene glycol dicaprylate; such phosphate esters as tricresyl phosphate and triphenyl phosphate; such aliphatic dibasic acid esters as diisobutyl adipate, dioctyl adipate, dimethyl sebacate, dibutyl sebacate, dioctyl azelate and dibutyl maleate; polyglycidyl methacrylate, triethyl citrate, glycerin triacetyl ester and butyl laurate. These plasticizers may be used alone or in combination and the amount thereof used is not more than about 5% by weight based on the total weight of the light-sensitive composition.

The components for imparting print out properties to the light-sensitive layer are agents or compositions for obtaining a visible image immediately after imagewise exposure. Examples thereof are pH indicators as disclosed in U.K. Patent No. 1,041,463; a combination of o-naphthoquinonediazide-4-sulfonyl chloride with a dye as disclosed in U.S. Pat. No. 3,969,118; and photochromic compounds as disclosed in J.P. KOKOKU No. Sho 44-6413.

Moreover, the sensitibity of the light-sensitive layer can be enhanced by adding a cyclic acid anhydride to the layer as disclosed in J.P. KOKAI No. Sho. 52-80022 (U.S. Pat. No. 4,115,128).

These light-sensitive compositions comprised of o-naphthoquinonediazide compounds are dissolved in a proper solvent and applied to the surface of a substrate. Examples of such suitable solvents include such glycol ethers as ethylene glycol monomethyl ether, ethylene glycol monoethyl ether, 1-methoxy-2-propanol, diethylene glycol dimethyl ether, ethyl acetate and 2-methoxyethyl acetate; such ketones as acetone, methyl ethyl ketone and cyclohexanone; and such chlorinated hydrocarbons as ethylene dichloride.

The amount of the light-sensitive layer comprised of o-quinonediazide compounds to be applied to the surface of a substrate preferably ranges from about 0.5 to about 7 g/m$^2$ and more preferably 1.5 to 3 g/m$^2$ (expressed in the amount weighed after drying).

The light-sensitive layer of the positive-working PS plate thus prepared is made alkaline-soluble by irradiating with rays rich in actinic rays from a light source such as a carbon arc lamp, a mercury lamp, a metal halide lamp, a xenon lamp or a tungsten lamp. Therefore, if it is processed with the developer of the present invention, exposed parts of the light-sensitive layer are dissolved out and thus the hydrophilic surface of the substrate is exposed.

If the developer of this invention is applied to these light-sensitive materials, developing stability of the latter is enhanced and handling thereof becomes easier and processing cost can be reduced since processability is improved. In addition, any precipitates are not formed even when the developer is deteriorated and any troubles concerning an automatic developing machine during operation can be eliminated.

Furthermore, if the developer composition of the present invention comprises the aforementioned organic solvent and anionic surfactant as well as the alkaline-soluble mercapto compound, it is found that negative-working PS plates can also be processed with the same developer composition. The negative-working PS plates have widely been used like the positive-working PS plates. However, the composition of a developer therefor in general differs from that used for developing the positive-working PS plates. Therefore, to process both these PS plates, the use of a plurality of processing devices are required. This is economically quite unfavorable. Moreover, wide space is required for installing these devices and workability is not so good. These disadvantages can effectively be overcome through the use of the developer of this invention. More specifically, since both negative- and positive-working PS plates can be processed with the same developer composition, it is not necessary to previously prepare two kinds of developer compositions and, therefore, operation efficiency is substantially improved.

Examples of light-sensitive diazo resins contained in the light-sensitive layer of the negative-working PS plate to which the developer composition of this invention is applied are those disclosed in U.S. Pat. Nos. 2,679,498; 3,050,502; 3,163,633 and 3,406,159; and J.P. KOKOKU Nos. Sho 49-48001 (B.P. 1,312,925) and Sho 49-45322 (U.S. Pat. No. 3,679,419) which are made substantially water-insoluble and organic solvent-soluble according to a method as disclosed in J.P. KOKOKU No. Sho 47-1167; U.S. Pat. No. 3,300,309; J.P. KOKAI Nos. Sho 54-98613, Sho 56-121031, Sho 59-78340, Sho 59-22834 and Sho 63-262643. In other words, the light-sensitive diazo resins are first prepared as inorganic salts such as a zinc chloride complex salt and then subjected to counterions exchange reaction to convert these salts to salts with organic compounds having either or both of phenolic hydroxide groups and sulfonic acid groups or hexafluoro-phosphates, tetrafluoroborates or complex salts thereof to thus obtain water-insoluble diazo resins.

A variety of hydrophobic resins which may be used in combination with the foregoing substantially water-insoluble diazo resins have been commonly known and used in the art. Whether the present invention can be applied to these resins or not is largely dependent upon requirements of individual plate making techniques. The resins must of course be lipophilic to impart sufficient ink receptivity to the resultant lithographic printing plate, it must show physical and chemical affinities for the light-sensitive diazo resins which are soluble in usual organic solvents and hardly soluble or completely insoluble in water and it must be formed into a film. Particularly, these resins desirably have a certain degree of hardness, elasticity and flexing properties to provide excellent affinity for ink as a substrate for forming an ink film thereon and to bear friction during printing operation to thus provide several tens of thousands to several hundreds of thousands of printed matters.

Examples of such resins which satisfy the aforementioned requirements include epoxy resins, polyamide resins, halogenated vinyl, especially polyvinyl chloride; polyvinylidene chloride, chlorinated polyolefins, polyvinyl acetate, acetal resins such as formal resin or butyral resins, soluble urethane resins such as those available form U.S. Good Rich Company under the trade name of ESTANE; polystyrene-maleic anhydride copolymer or half esters or half amides thereof; cellulose derivatives, shellac, rosin or modified products thereof; acrylic acid-acrylate copolymer, multi-component copolymer of 2-hydroxyethyl acrylate or 2-hydroxyethyl methacrylate, acrylonitrile or methacrylonitrile, acrylic acid or methacrylic acid and optionally other copolymerizable monomers as disclosed in J.P. KOKAI No. Sho. 50-118802 (U.S.P. 4,123,276); multi-component copolymers of acrylic acid or methacrylic acid whose termini is hydroxyl group and which is esterified with a group having dicarboxylic acid residues, acrylic acid or methacrylic acid and optionally other copolymerizable monomers as disclosed in J.P. KOKAI No. Sho 53-120903; multi-component copolymers of a monomer having aromatic hydroxyl group such as N-(4-hydroxyphenyl)-methacrylamide, acrylic acid or methacrylic acid, and optionally other copolymerizable monomers as disclosed in J.P. KOKAI No. Sho 54-98614; and multi-component copolymers of alkyl acrylate, acrylonitrile or methacrylonitrile, and unsaturated carboxylic acid as disclosed in J.P. KOKAI No. Sho 56-4144. In addition to these compounds, acidic polyvinyl alcohol derivatives and acidic cellulose derivatives are also preferable. Moreover, other useful compounds include polymer compounds as disclosed in J.P. KOKOKU No. Sho 54-19773 (U.S. Pat. No. 3,732,105), and J.P. KOKAI Nos. Sho 57-94747 (U.S. Pat. No. 4,387,151), Sho 60-182437 (U.S. Pat. No. 4,631,245), Sho 62-58242 and Sho 62-123453 (B.P. 2,185,120) which are polyvinyl acetal and polyurethane made alkali-soluble.

The water-insoluble diazo resin and the foregoing hydrophobic resin are dissolved in a solvent such as lower alcohols, glycol ether, dialkyl-formamide, chlorinated solvent or a mixture thereof, optionally pigmented with a dye or a pigment, optionally mixed with other components such as plasticizers, dyes for obtaining a visible image immediately after imagewise exposure and stabilizers and applied onto the hydrophilic surface of a substrate as disclosed in J.P. KOKOKU Nos. Sho 47-5125 and Sho 48-9007. The developer composition of the present invention makes it possible to completely remove light-sensitive layer on non-exposed areas, without exerting any adverse effect on exposed areas, by using an automatic developing machine, bat, tank or the like or bringing the surface of the PS plate into contact with, for instance, absorbent wadding containing the developer and simultaneously rubbing the surface mechanically, for 20 to 30 seconds.

The present invention will hereinafter be explained in more detail with reference to the following non-limitative working Examples and the effects practically achieved by the present invention will also be discussed in comparison with the following Comparative Examples.

EXAMPLES 1 TO 3

A solution of a light-sensitive composition (hereunder referred to as "light-sensitive solution") was prepared by dissolving, in a mixture of 20 parts by weight of Cellosolve and 8 parts by weight of methyl ethyl ketone, 0.8 parts by weight of polyhydroxyphenyl naphthoquinone-1,2-diazide-5-sulfonic acid ester obtained through the condensation of acetone and pyrogallol as disclosed in Example 1 of J.P. KOKOKU No. Sho 43-28403 (U.S. Pat. No. 3,635,709); 22 parts by weight of novolak type meta-para mixed cresol-formaldehyde resin, 0.02 parts by weight of novolak type octylphenol-formaldehyde resin, 0.08 parts by weight of phthalic anhydride, 0.04 parts by weight of 2-trichloromethyl-5-(p-methoxystyryl)-1,3,4-oxadiazole and 0.03 parts by weight of p-toluenesulfonic acid salt of Crystal Violet. An aluminum plate of 0.3 mm thick which had been grained with a nylon brush was etched with an alkali, then subjected to electrolytic etching in an aqueous solution of nitric acid and anodized in an aqueous solution of sulfuric acid (the amount of the anodized layer formed: 2.7 g/m$^2$). Thereafter, the aluminum plate was treated with an aqueous solution of zinc acetate maintained at 70° C., sufficiently washed and then dried. The foregoing light-sensitive solution was applied to the surface of the aluminum plate thus treated with a whirler and then dried to form a PS plate provided thereon with about 20 g/m$^2$ of a light-sensitive layer. The PS plate was exposed to light through a step tablet having 0.15 density difference utilizing a PS Light (2 KW metal halide lamp available from Fuji Photo Film Co., Ltd.) as a light source.

On the other hand, a developer used was 2.5% by weight aqueous solution of sodium silicate having a molar ratio SiO$_2$/Na$_2$O of about 1.2 to which each compound listed in Table I was added.

TABLE I

| Ex. No. | Compound added to the aqueous solution | Amount (pbw) |
|---|---|---|
| 1 | —O—(CH$_2$CH$_2$O)$_{\overline{7}}$SO$_3$Na | 0.2 |
| 2 | C$_4$H$_9$—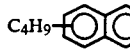—O—(CH$_2$CH$_2$O)$_{\overline{10}}$SO$_3$Na | 0.2 |
| 3 | —O—(CH$_2$CH$_2$O)$_{\overline{15}}$SO$_3$Na | 0.3 |
| Comp. Ex. 1 | None | |

*The abbreviation "pbw" means part by weight.

Two sheets of exposed PS plates were immersed in the developer maintained at 25° C. for one minute and 5 minutes respectively, then washed with water and were examined on solid step number. The results are listed in Table II. As seen from Table II, in Examples 1 and 2, it is found that the difference between the solid step numbers observed on these two samples is very small, which means the developing stability of the developer is very excellent. On the other hand, each developer was allowed to stand for several days after processing 3 m$^2$/l and the amount of feculence. sludge formed during storage was evaluated. In Comparative Example 1, the amount thereof is largest.

TABLE II

| Ex. No. | Solid Step Number | |
|---|---|---|
| | After 1 min. | After 5 min. |
| 1 | 3 | 4 |
| 2 | 3.5 | 4.5 |
| 3 | 3 | 4.5 |
| Comp. Ex. 1 | 7 | 12 |

EXAMPLES 4 AND 5

Dioxane (300 g) was heated to 100° C. in a stream of nitrogen gas and a solution of a mixture of 150 g of 2-hydroxyethyl methacrylate, 60 g of acrylonitrile, 79.5 g of methyl methacrylate, 10.5 g of methacrylic acid and 1.2 g of benzoyl peroxide was dropwise added to dioxane over two hours. After completing the dropwise addition, the mixture was diluted with methanol, then poured into water to precipitate the resultant copolymer and the precipitates was dried in vacuo at 70° C. The acid value of this 2-hydroxyethyl methacrylate copolymer (I) was 20. The viscosity of this copolymer measured at 25° C. (33% ethylene glycol monomethyl ether solution) was 4,500 cps.

An aluminum plate of 2 S material having a thickness of 0.15 mm was immersed in 10% aqueous solution of sodium tertiary phosphate maintained at 80° C. for 30 seconds to degrease, gained with a nylon brush with pouring a slurry of pumice stone on the aluminum plate, etched by immersing it in sodium aluminate solution at 60° C. for 10 seconds and washed with 3% aqueous solution of sodium hydrogen sulfate. The aluminum plate was anodized in 20% sulfuric acid solution at a current density of 2 A/dm² for two minutes and subsequently treated by immersing in 2.5% aqueous solution of sodium silicate at 70° C. for one minute to obtain an anodized aluminum plate (I).

The following light-sensitive solution was applied onto the surface of the aluminum plate (I) and was dried at 100° C. for two minutes. The coated amount of the light-sensitive solution was 2.1 g/m² (weighed after drying).

| Composition of Light-sensitive Solution | |
|---|---|
| Component | Amount (g) |
| 2-Hydroxyethyl methacrylate copolymer (I) | 0.87 |
| 2-Methoxy-4-hydroxy-5-benzoylbenzene sulfonic acid salt of condensate of p-diazodiphenylamine and paraformaldehyde | 0.1 |
| Oil Blue #603 (available from ORIENT CHEMICAL INDUSTRIES LTD.) | 0.03 |
| 2-Methoxyethanol | 6 |
| Methanol | 6 |
| Ethylene dichloride | 6 |

The resulting PS plate was imagewise exposed to light, for 45 seconds, from a light source (a 30 A carbon arc lamp) at distance 70 cm from the plate. Then the plate was developed with developers having the composition listed in Table III at 25° C. for 30 seconds.

TABLE III

| | Ex. 4 | Ex. 5 | Comp. Ex. 2 |
|---|---|---|---|
| Pelex NBL (38% aq. soln.) | 11 | 11 | 11 |
| Phenyl Cellosolve | 0.8 | 0.8 | 0.8 |
| Compound of formula (I) | naphthyl-O(CH₂O)₄SO₃Na  1.0 | naphthyl-O(CH₂O)₁₂SO₃Na  1.0 | None |
| HS-C₆H₄-SO₃H | 0.2 | 0.2 | 0.2 |

Each developer comprises 2.0% by weight aqueous solution of sodium silicate having a molar ratio SiO₂/Na₂O of 1.1 to which desired amount of the foregoing compounds listed in table III were added.

As a result, un-exposed areas were be dissolved out completely in all cases.

Printing operations were performed using the lithographic printing plates obtained in Examples 4 and 5 and Comparative Example 2 and in any case, good printed matters were obtained. In Examples 4 and 5, the deteriorated processing solutions obtained after processing 3 m²/l did not form sludge even when the evaporation loss thereof exceeded 25% while in Comparative Example 2, there was observed the generation of sludge when the evaporation loss of the deteriorated processing solution exceeded 15%.

On the other hand, the positive-working PS plate used in Example 1 was exposed to light through the step tablet used therein, developed in each of the foregoing developers at 25° C. for one minute or 5 minutes and the difference between the solid step numbers observed was examined. The results obtained are summarized in Table IV. As seen from the results listed in Table IV, when the developers of Examples 4 and 5 were used, the difference was very small compared with that observed when the developer of Comparative Example 2 was used. This clearly shows that the developing stability of the developers of Examples 4 and 5 are very excellent.

In addition, processability of developer is not less than 3 m²/l in both Examples 4 and 5 and the amount of feculence. sludge observed in Examples 4 and 5 is far smaller than that observed in Comparative Example 2.

TABLE IV

| Ex. No. | Solid Step Number | |
|---|---|---|
| | After 1 min. | After 5 min. |
| 4 | 8 | 9.5 |
| 5 | 8 | 9.5 |

TABLE IV-continued

| Ex. No. | Solid Step Number | |
|---|---|---|
| | After 1 min. | After 5 min. |
| Comp. Ex. 2 | 11 | not less than 15 |

EXAMPLE 6

An aluminum plate was immersed in an aqueous solution of sodium phosphate to degrease, grained with a brush, subjected to electrolytic graining, then anodized in a sulfuric acid solution and further immersed in an aqueous solution of sodium silicate to hydrophilize. The amount of the anodized layer was 2.5 g/m².

The following light-sensitive solution (1) was applied onto the surface of the hydrophilized aluminum plate to obtain a PS plate (1). The coated amount of the light-sensitive solution was 1.8 g/m².

| Light-sensitive Solution (1) | |
|---|---|
| Component | Amount (g) |
| Organic polymeric compound (1) | 5.0 |
| Diazo compound (1) | 0.5 |
| Victoria Pure Blue BOH | 0.15 |
| Sodium t-butyl naphthalene sulfonate | 0.15 |
| Phosphorous acid | 0.1 |
| Water | 5.0 |
| 1-Methoxy-2-propanol | 45.0 |
| Methyl ethyl ketone | 50.0 |

In the foregoing composition, the organic polymeric compound (1) is a p-hydroxyphenyl methacrylamide/2-hydroxyethyl methacrylate/acrylonitrile/methyl methacrylate/methacrylic acid (weight ratio=15/20/25/35/5) copolymer having an average molecular weight of 60,000.

The diazo compound (1) is an n-dodecylbenzene-sulfonate salt of 4-diazophenylamine/formaldehyde resin disclosed in Preparation Example 1 of J.P. KOKAI No. Sho 63-262643.

This negative-working PS plate and the positive-working PS plates described in Examples 1 to 3 were developed with a developer composed of 2.0% by weight aqueous solution of potassium silicate having a molar ratio $SiO_2/K_2O$ of 1.2 to which each of the following compounds was added. Printing operations were performed using the resultant lithographic printing plates and in all the cases, good printed matters were obtained. Moreover, processability of these developers was high and only a small amount of feculence.sludge was generated.

| Additive | Amount (wt %) |
|---|---|
| Pelex NBL (38% aqueous solution) | 11 |
| Benzyl alcohol | 0.8 |
| Compound of general formula (I) | 1.0 |
| 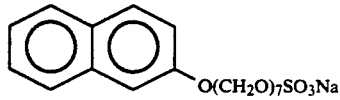 $O(CH_2O)_7SO_3Na$ | |
| Thiosalicylic acid | 0.25 |

As explained above, negative-working and positive-working PS plates can be processed with the same developer according to the present invention.

What is claimed is:

1. A method of preparing a lithographic printing plate comprising the steps of:
   (i) imagewise exposing to light a positive working presensitized lithographic plate comprising a support having a light-sensitive layer containing an o-quinone diazide compound, and
   developing the image-wise light-exposed presensitized lithographic plate with a developer composition comprising water, an alkali silicate and at least one compound having at least one aryl group, at least one oxyalkylene group and at least one sulfate ester group or sulfonic acid group.

2. A method of developing a presensitized plate which comprises the steps of:
   (i) developing an imagewise light-exposed positive working presensitized lithographic plate comprising a support having an imagewise light-exposed positive working light-sensitive layer containing an o-quinone diazide compound with a developer composition to remove light-exposed areas of the positive working light-sensitive layer, to provide a lithographic printing plate, and
   (ii) developing an imagewise light-exposed negative working presensitized lithographic plate comprising a support having an imagewise light-exposed negative working light-sensitive layer containing a diazo resin with a developer composition to remove light-unexposed areas of the negative light-sensitive layer, to provide a lithographic printing plate
   said developer composition for the positive working presensitized lithographic plate and said developer composition for the negative working presensitized lithographic plate each comprising water, an alkali silicate, at least one compound having at least one aryl group, at least one oxyalkylene group and at least one sulfate ester group or sulfonic acid group and organic solvents and/or anionic surfactants, the organic solvent being selected from those having solubility in water of not more of 10% by weight and the anionic surfactant being selected from the group consisting of $C_8$ to $C_{22}$ higher alcohol sulfate ester salts, aliphatic alcohol sulfate ester salts, alkyl aryl sulfonic acid salts, sulfonic acid salts of alkylamides, sulfonic acid salts of dibasic aliphatic acid esters and combinations thereof.

3. A method of claim 2, wherein the method comprises developing the positive working and the negative working lithographic plates with a developer composition wherein the organic solvent is selected from the group consisting of 1-phenyl ethanol, 2-phenyl ethanol, 3-phenyl-propanol-1; 4-phenyl-butanol-1; 4-phenyl-butanol-2; 2-phenyl-butanol-1; 2-phenoxy ethanol, 2-benzyloxy ethanol, o-methoxybenzyl alcohol, m-methoxybenzyl alcohol, p-methoxybenzyl alcohol, benzyl alcohol, cyclohexanol, 2-methyl cyclohexanol, 4-methyl cyclohexanol, 3-methyl cyclohexanol and a combination thereof.

4. A method of claim 2, wherein the method comprising developing the positive working and the negative working lithographic plates with a developer composition wherein the amount of the anionic surfactant ranges from 0.1 to 5% by weight and the amount of the organic solvent ranges from 1 to 5% by weight on the basis of the total weight of the developer practically used.

5. A method of claim 2, wherein the method comprises developing the positive working the negative working lithographic plates with a developer composition further comprising at least one alkali-soluble compound and/or thioether compound.

6. A method of claim 5, wherein the method comprises developing the positive working and the negative working lithographic plates with a developer composition wherein the alkali-soluble mercapto compound and/or thioether compound ranges from 0.01 to 5% by weight on the basis of the total weight of the composition.

7. A process of claim 2, wherein said each developer composition further comprises at least one alkali-soluble mercapto compound having at least one mercapto group and at least one carboxyl group in an amount of from 0.001 to 10% by weight based on the total weight of the composition.

8. A process of claim 7, wherein the alkali-soluble mercapto compound is thiosalicylic acid, N-(2,3-dimercapto-propionyl)glycine, 2-(1,2-dicarboxyethylthio)-5-mercapto-1,3,4-thiadiazole, 4-mercapto-benzene sulfonic acid, N-(2-mercapto-2-methyl-propionyl)cysteine or cysteine.

* * * * *